United States Patent
Ritter (10) Patent No.: US 10,296,041 B2
(45) Date of Patent: May 21, 2019

(54) VACUUM HOLD-DOWN OF SEAMLESS IMAGE PANEL TO POLYCARBONATE PROTECTIVE FRONTPLANE

(71) Applicant: PRYSM, Inc., San Jose, CA (US)

(72) Inventor: John L. Ritter, Harvard, MA (US)

(73) Assignee: PRYSM, INC., San Jose, CA (US)

( * ) Notice: Subject to any disclaimer, the term of this patent is extended or adjusted under 35 U.S.C. 154(b) by 67 days.

(21) Appl. No.: 15/602,936

(22) Filed: May 23, 2017

(65) Prior Publication Data

US 2018/0157349 A1    Jun. 7, 2018

Related U.S. Application Data

(60) Provisional application No. 62/430,240, filed on Dec. 5, 2016.

(51) Int. Cl.
| | |
|---|---|
| *G06F 1/16* | (2006.01) |
| *G02F 1/13* | (2006.01) |
| *G02F 1/1333* | (2006.01) |
| *G06F 3/14* | (2006.01) |
| *H01L 27/32* | (2006.01) |

(52) U.S. Cl.
CPC ............. *G06F 1/16* (2013.01); *G02F 1/13* (2013.01); *G02F 1/13336* (2013.01); *G06F 1/1601* (2013.01); *G06F 1/1641* (2013.01); *G06F 1/1652* (2013.01); *G06F 3/1446* (2013.01); *H01L 27/3293* (2013.01)

(58) Field of Classification Search
CPC ..................................... G06F 1/16; G02F 1/13
See application file for complete search history.

(56) References Cited

U.S. PATENT DOCUMENTS

| | | | | |
|---|---|---|---|---|
| 2003/0179167 A1* | 9/2003 | Kolluri | ................ | G02B 26/026 345/85 |
| 2004/0135505 A1* | 7/2004 | Hasegawa | ............... | H01J 9/385 313/553 |

* cited by examiner

*Primary Examiner* — Peter D McLoone
(74) *Attorney, Agent, or Firm* — Patterson & Sheridan, LLP; Steven Versteeg (57) ABSTRACT

The disclosure described herein generally relates to an image panel and a method of compressing the image panel. A breather assembly is coupled to at least one edge of the image panel and a vacuum is drawn through the breather assembly to pull the image panel portion and the front panel into intimate contact with phosphors sandwiched therebetween. The breather assembly draws the vacuum from the air pockets between adjacent phosphors to pull the image panel flat and thus prevent image artifacts from forming while also permitting the image panel portion and the front plane panel to move independently.

27 Claims, 6 Drawing Sheets

VACUUM HOLD-DOWN OF SEAMLESS IMAGE PANEL TO POLYCARBONATE PROTECTIVE FRONTPLANE

CROSS-REFERENCE TO RELATED APPLICATIONS

This application claims benefit of U.S. Provisional Patent Application Ser. No. 62/430,240, filed Dec. 5, 2016, which is herein incorporated by reference.

BACKGROUND

Field

Embodiments of the present disclosure generally relate to drawing a vacuum between two panels of a display device.

Description of the Related Art

Electronic display systems are commonly used to display information from computers and other sources. Typical display systems range in size from small displays used in mobile devices to very large displays, such as tiled displays, that are used to display large size images and video. Tiled display systems are generally made up of multiple smaller individual display devices, or "tiles", that are carefully aligned when assembled to provide a seamless and uniform appearance. In some embodiments, each tile may be a light-based electronic display device, such as a laser-phosphor display (LPD), including a self-contained laser-based image-generating system.

The tiles are oftentimes made of a protective front plane panel that is shared by, or common to, several image panel portions with each image panel portion being considered to be a tile. A plurality of phosphors are sandwiched between the front plane panel and the image panel portion. The tiles are oftentimes rolled up for shipping purposes. Additionally, there are air pockets between the image panel portion and the front plane panel at locations between the phosphors. Due to the rolling and/or the air pockets, the image panel portion and the front plane panel may move and thus, lead to image artifacts during operation. Furthermore, the tiles, collectively together as an image panel, should be as flat as possible and also should be in intimate contact to prevent the image artifacts.

Accordingly, there is a need in the art for an image panel that can be rolled and yet also prevent image artifacts.

SUMMARY

The disclosure described herein generally relates to an image panel and a method of compressing the image panel. A breather assembly is coupled to at least one edge of the image panel and a vacuum is drawn through the breather assembly to pull the image panel portion and the front panel into intimate contact with phosphors sandwiched therebetween. The breather assembly draws the vacuum from the air pockets between adjacent phosphors to pull the image panel flat and thus prevent image artifacts from forming while also permitting the image panel portion and the front plane panel to move independently.

In one embodiment, a method of compressing an image panel set together to reduce relative movement during thermal expansion of the image panel, wherein the image panel has one or more sealing gaskets coupled to two or more side edge regions thereof, and a breather assembly coupled to the image panel at a top side and a bottom side thereof is disclosed. The method comprises drawing a vacuum through the breather assembly at the top side for a first period of time; and drawing a vacuum through the breather assembly at the bottom side for a second period of time, wherein the second period of time occurs after the first period of time and wherein the two panels are maintain a substantially uniformly spatial gap across the entire image panel following the second period of time.

In another embodiment, a vacuum enclosed image panel device comprises a first panel having a top edge, a bottom edge, a first side edge and a second side edge; a second panel having a top edge, a bottom edge, a first side edge and a second side edge; and a first breather assembly coupled between the first and second panel, wherein the first panel and the second panel are substantially uniformly spaced apart under vacuum to reduce relative movement during thermal expansion.

In another embodiment, a vacuum enclosed image panel device comprises a first panel having a top edge, a bottom edge, a first side edge and a second side edge, wherein the first panel is a multilayer structure having: an anti-glare coating; a first polyethylene terephthalate layer disposed on the anti-glare coating; a first pressure sensitive adhesive on the first polyethylene terephthalate layer; a polycarbonate layer disposed on the pressure sensitive adhesive; a second pressure sensitive adhesive on the polycarbonate layer; a second polyethylene terephthalate layer disposed on the second pressure sensitive adhesive; a second panel having a top edge, a bottom edge, a first side edge and a second side edge, wherein the second panel is disposed opposite the anti-glare coating of the first panel; and a first breather assembly, wherein the first breather assembly includes: a third pressure sensitive adhesive layer coupled to the second panel; a fourth pressure sensitive adhesive layer coupled to the first panel; and a gasket coupled to the third pressure sensitive adhesive layer and the fourth pressure sensitive adhesive layer, wherein the first panel and the second panel are substantially uniformly spaced apart under vacuum to reduce relative movement during thermal expansion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

The disclosure described herein generally relates to an image panel and a method of compressing the image panel. A breather assembly is coupled to at least one edge of the image panel and a vacuum is drawn through the breather assembly to pull the image panel portion and the front panel into intimate contact with phosphors sandwiched therebetween. The breather assembly draws the vacuum from the air pockets between adjacent phosphors to pull the image panel flat and thus prevent image artifacts from forming while also permitting the image panel portion and the front plane panel to move independently.

Figure 1:
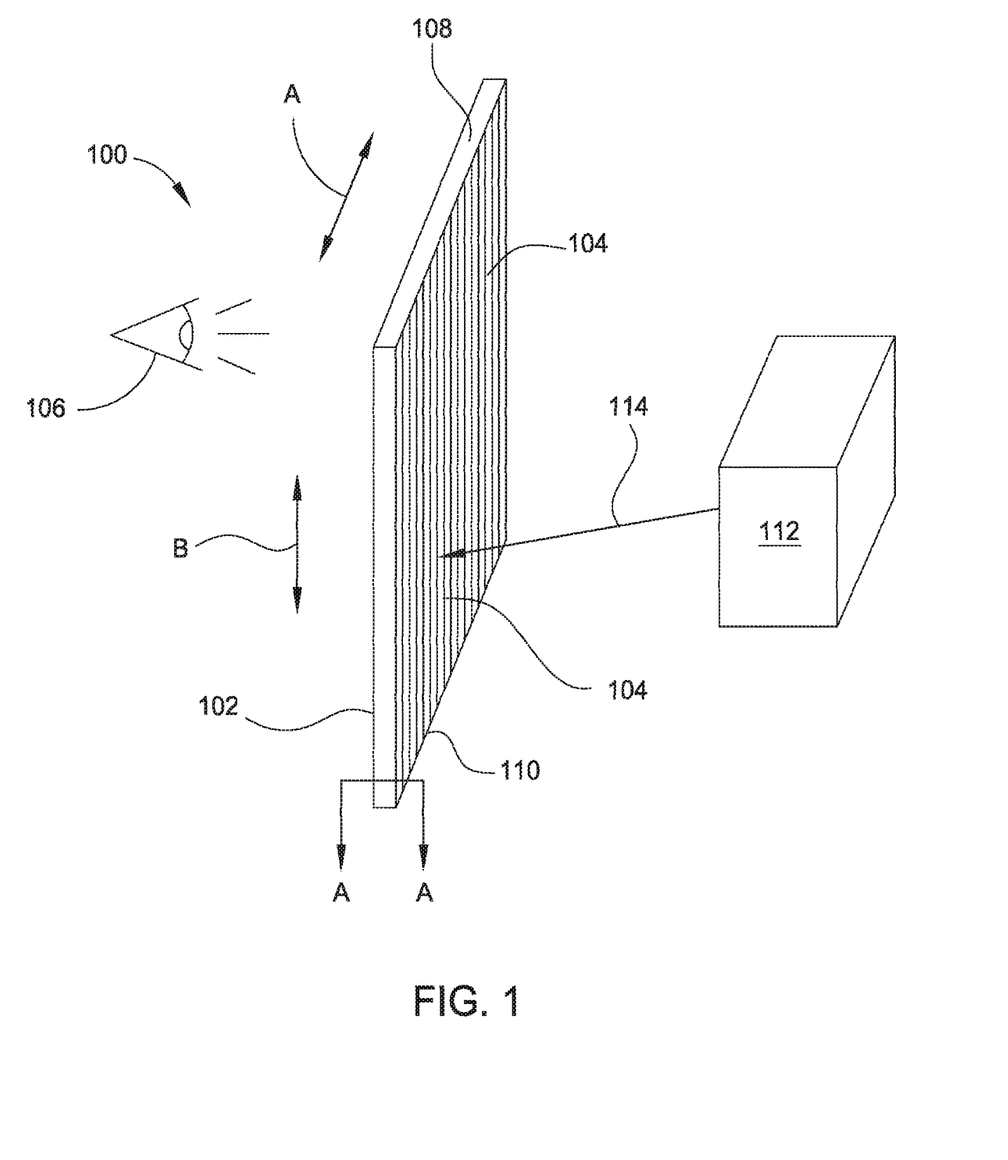
FIG. 1 is a perspective schematic diagram of a display system, according to embodiments of the disclosure.

FIG. 1 is a perspective schematic diagram of a display system 100, according to embodiments of the disclosure. Display system 100 is a light-based electronic display device configured to produce video and static images for a viewer 106. The display system 100 includes light-emitting phosphors 104 disposed between two planes. For example, display system 100 may be a LPD or other phosphor-based display device. While shown as a single image panel 102 in FIG. 1, it is to be understood that the image panel 102 may include a plurality of image panels seamlessly coupled together. For example, the image panel 102 may comprise one or more protective front plane panels and one or more image panel portions with a plurality of phosphors 104 coupled therebetween. FIG. 1 shows a plurality of phosphors 104 extending from the top 108 of the image panel 102 to the bottom 110 of the image panel 102.

The display system 100 includes a light source 112, such as a laser module, that is used to produce one or more scanning light beams 114, such as laser beams, to excite the phosphors 104 in image panel 102. The phosphors 104 are stripes that are made up of alternating phosphor material of different colors, e.g., red, green, and blue, where the colors are selected so that they can be combined to form white light and other colors of light. Scanning light beam 114 is a modulated light beam that includes optical pulse width and/or amplitude variable pulses that carry image information and is scanned across image panel 102 along two orthogonal directions, e.g., horizontally (parallel to arrow A) and vertically (parallel to arrow B), in a raster scanning pattern to produce an image on image panel 102 for viewer 106. In some embodiments, scanning light beam 114 includes visible lasers beams of one or more colors that discretely illuminate individual subpixels of the phosphors 104 to produce an image. The scanning light beam 114 can be of a specific width and height, so as to excite only a specific phosphor 104 or group of phosphors 104 at one time, such as a scanning laser beam, which is approximately 700 μm tall and approximately 100 μm wide. A feedback control alignment mechanism can be provided in the system 100 to maintain proper alignment of the scanning beam 114 on the desired sub-pixel to achieved desired image quality.

Figure 2A:
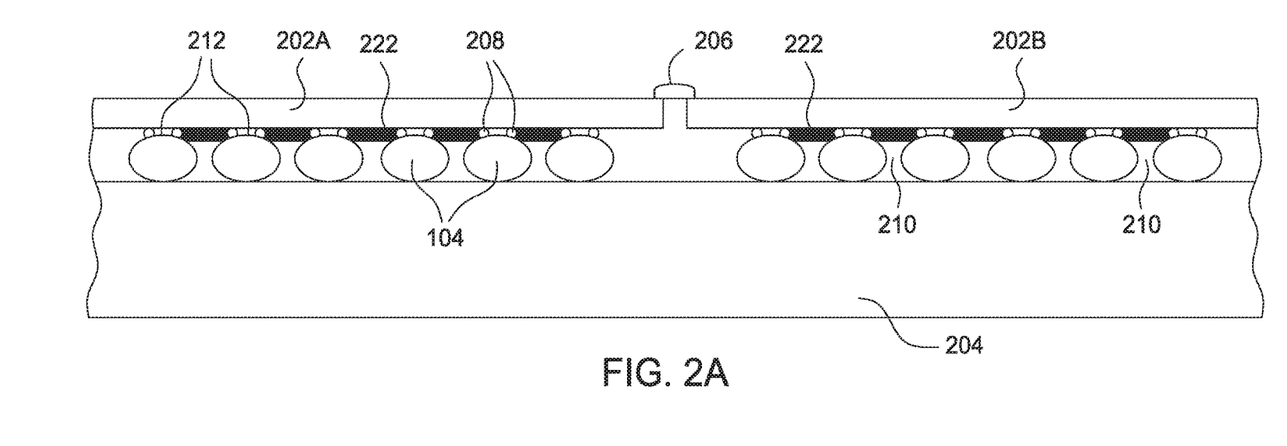
FIG. 2A is a schematic cross-sectional illustration of an image panel 102 according to one embodiment.
Figure 2B:
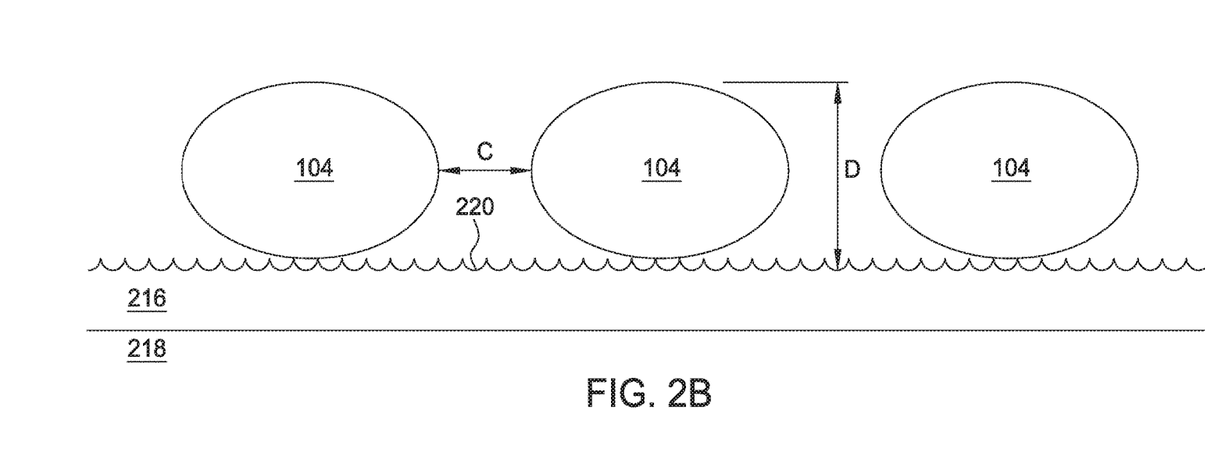
FIG. 2B is a zoomed-in view of the image panel 102 shown in FIG. 2A.

FIG. 2A is a schematic cross-sectional illustration of an image panel 102 according to one embodiment. FIG. 2B is a zoomed-in view of the image panel 102 shown in FIG. 2A. The image panel 102 includes a plurality of image panel portions 202A, 202B or tilettes that are coupled together with tape 206. The image panel 102 also includes a protective front plane panel 204. The phosphors 104 are sandwiched between the image panel portions 202A, 202B and the front plane panel 204. The phosphors 104 are spaced from the image panel portions 202A, 202B by spacers 208. Low index of refraction material stripes 210 are present between the phosphors 104 and second low index of refraction material pockets 212 are present between the phosphors 104, image panel portions 202A, 202B and spacers 208. The low index of refraction materials separates the phosphors. Additionally, a resin 222 is present. The resin 222 and the spaces 208 are distinct from one another and collectively attach the phosphors 104 to the image panel portions 202A, 202B. The resin 222 is disposed between adjacent spacers 208 of adjacent phosphors 104, but is not disposed between adjacent spacers 208 associated with a phosphor 104. In one embodiment, the resin 222 is a black resin and the spacer 208 is a clear resin. In one embodiment, the low index of refraction material comprises air, in order to reduce the total internal reflection (TIR) between the phosphors and the panel, thereby increasing the light emanating from the phosphors when excited by the excitation light and improving color parity. As shown in FIG. 2B, the front plane panel 204 includes an anti-glare coating 216 disposed on the remaining layers 218 of the front plane panel 204. The anti-glare coating 216 has a non-planar surface 220 to prevent the optical contact of the anti-glare coating 216 with the phosphors 104. The anti-glare coating 216 is low friction to permit the phosphors 104 to move on the anti-glare coating 216 while the image panel 102 is under vacuum. The phosphors 104 move when the image panel 102 is rolled up for transport or storage. The smoothness of the low friction panel allows for a slight shift of the phosphors over the low friction panel so that the phosphors do not tear as the panel thermally stretches and compresses when the panel is rolled for transport. If the phosphors 104 did not move, then the image panel 102 would not be rollable because any rolling of the image panel 102 would cause the image panel 102 to break. The anti-glare coating 216 has a glossiness range of between about 806 u to about 906 u. In contrast, the phosphors 104 have a relatively smooth surface, when compared to the anti-glare coating 216. The less contact between the phosphors 104 and the anti-glare coating 216 that can occur will be preferable because too much contact will lessen the brightness of the phosphors 104 and reduce color purity when viewed by the viewer 106 or in use. Image quality for the image panel 102 is most uniform when the image panel portions 202A, 202B are in intimate contact, but not optical contact) with the front plane panel 204. Without the vacuum to pull the image panel portions 202A, 202B into intimate contact with the front plane panel 204, the overall image quality for the image panel 102 would suffer because of internal reflection within the stripes 210 and pockets 212. The front plane panel 204 has a coefficient of thermal expansion that is greater than the coefficient of thermal expansion for the image panel portions 202A-202B.

The First low index of refraction material stripes 210 between adjacent phosphors 104 are generally between about 57 microns and about 61 microns wide as shown by arrows "C" and between about 55 microns and about 47 microns and about 52 microns deep as shown by arrows "D". In one embodiment, it is the air that is within the first low index of refraction material stripes 210 and the air that is within the second low index of refraction material pockets 212 that is drawn out during the vacuum process.

Figure 2C:
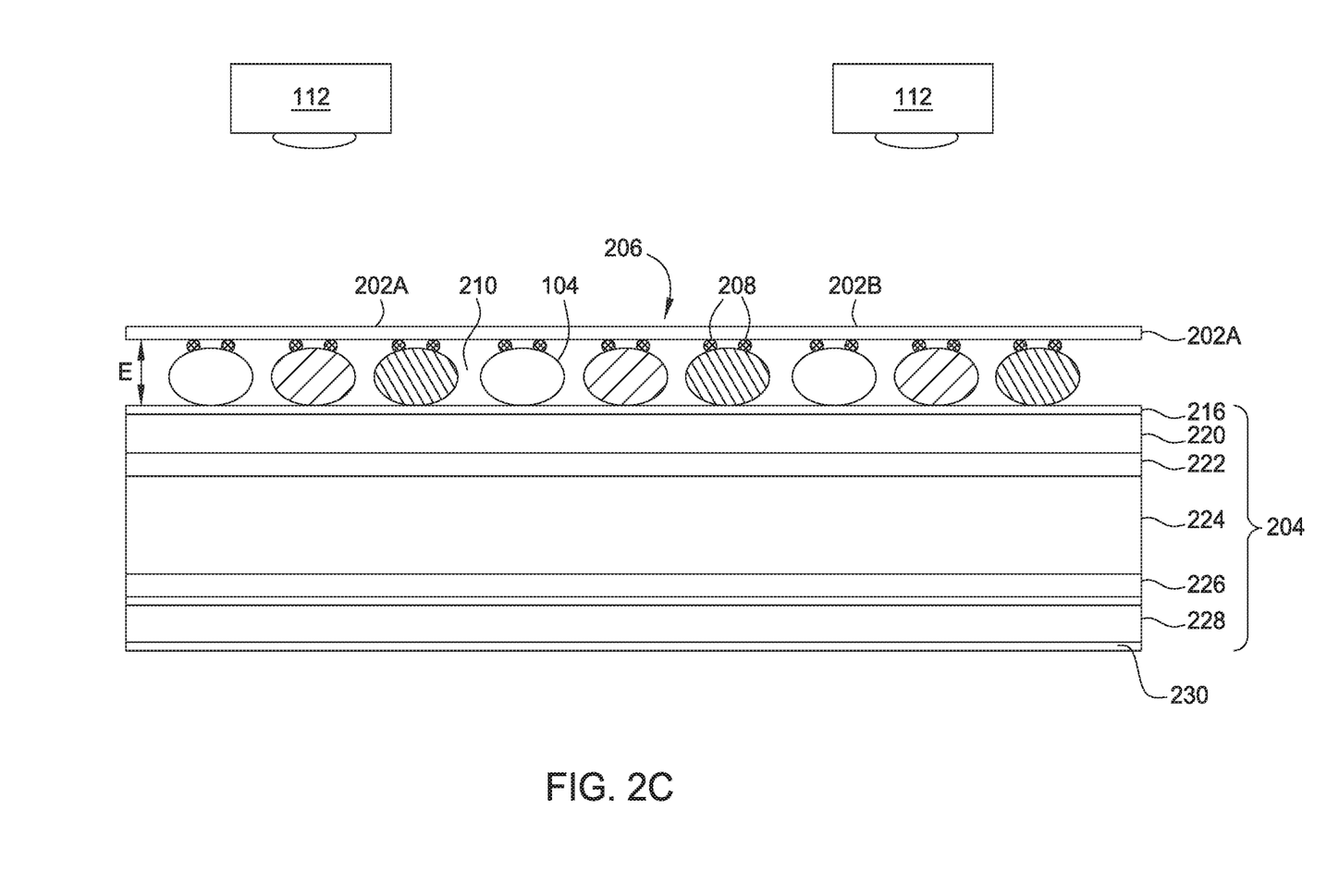
FIG. 2C is a schematic cross-sectional illustration of the image panel 102 with a more detailed illustration of the protective front plane panel 204.

FIG. 2C is a schematic cross-sectional illustration of the image panel 102 with a more detailed illustration of the protective front plane panel 204. FIG. 2C illustrates two separate light sources 112, but as noted above, it is to be noted that more or less light sources 112 may be utilized. The protective front plane panel 204 includes the anti-glare coating 216, a first polyethylene terephthalate layer 220 disposed on the anti-glare coating 216, a first pressure sensitive adhesive layer 222 disposed on the first polyethylene terephthalate layer 220, a polycarbonate layer 224 disposed on the first pressure sensitive adhesive layer 222, a second pressure sensitive adhesive layer 226 disposed on the polycarbonate layer 224, a second polyethylene terephthalate layer 228 disposed on the second pressure sensitive adhesive layer 226 and an anti-glare layer 230 disposed on the second polyethylene terephthalate layer 228. The first and second polyethylene terephthalate layers 220, 228 each may have a thickness of between 20 microns to 70 microns. The first and second pressure sensitive adhesive layers 222, 226 each may have a thickness of between 20 microns to 70 microns. The polycarbonate layer 224 may have a thickness of between 2 mm and 6.00 mm.

Figure 3:
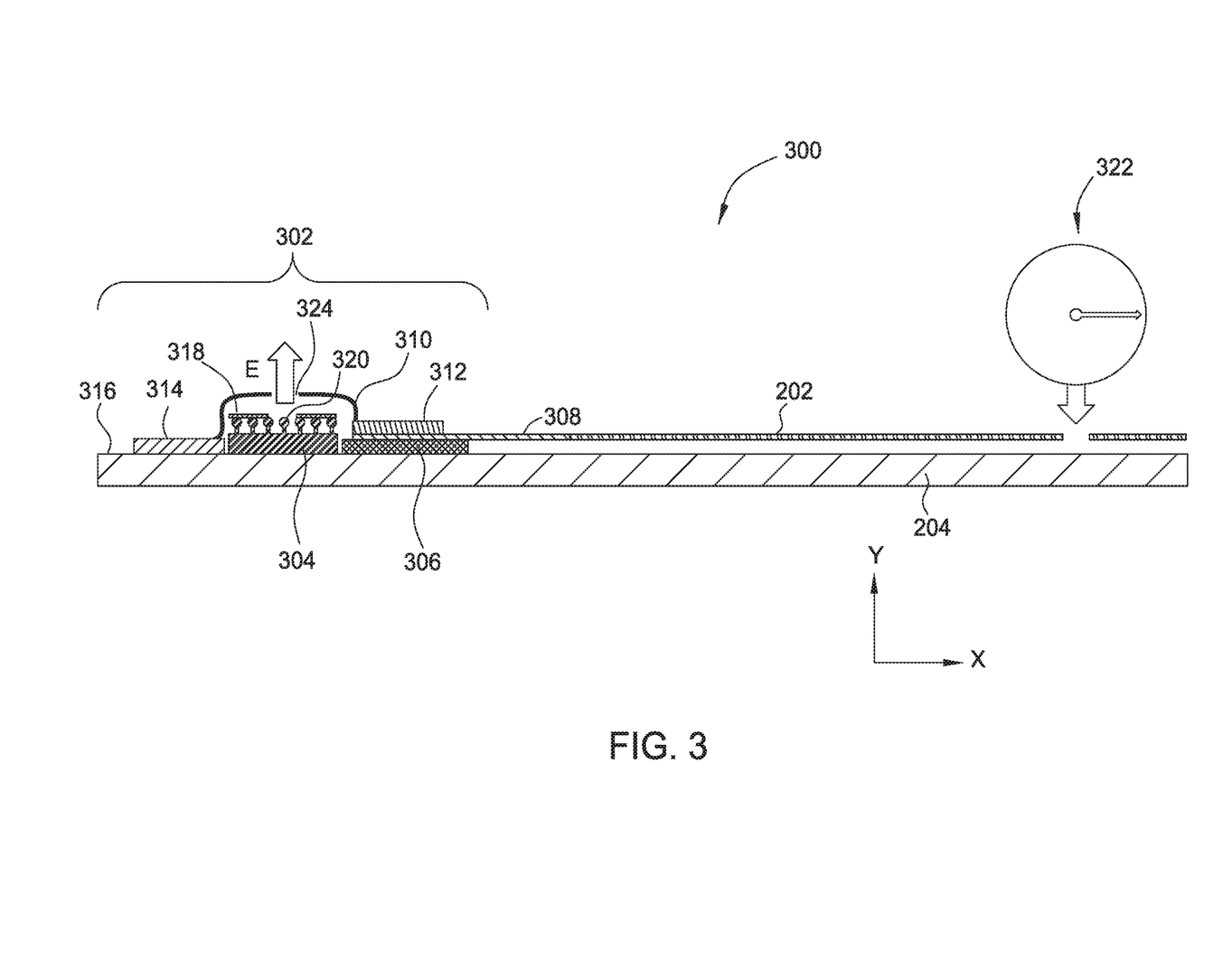
FIG. 3 is a schematic illustration of a breather assembly of an image panel device.

FIG. 3 is a schematic illustration of a breather assembly 302 of an image panel device 300. The phosphors 104 are not shown for clarity purposes, but it is to be understood that the phosphors 104 extend in the "X" direction. By "extend", it is to be understood that each individual phosphors 104 have a length and a width with the length spanning a distance from the relative "top" of the image panel 102 to the relative "bottom" of the image panel and thus, each individual phosphor "extends" in the "X" direction. Each individual phosphor 104 is thus like a "stripe" in terms of orientation within the image panel 102. The phosphors 104 thus "extend" parallel to the stripes 210 and pockets 212. The breather assembly 302 includes first breather subassembly 304 and a separate and distinct second breather subassembly 306. The first breather subassembly 304 has a first rigidity and a first thickness while the second breather subassembly 306 has a second thickness and a second rigidity, wherein the first thickness is greater than the second thickness and the first rigidity is greater than the second rigidity. The second breather subassembly 306 is disposed between the image panel portion 202 and the front plane panel 204. More specifically, the second breather subassembly 306 is disposed between an edging 308 of the image panel portion 202 and the front plane panel 204. The second breather subassembly 306 is positioned at a location to be spaced from the ends of the phosphors 104.

A gasket 310 is used to seal the breather assembly 302. The gasket 310 is adhered to the outer surface 326 of the edging 308 with double sided vacuum tape 312 such that the tape 312 is disposed between the outer surface 326 and the gasket 310. The gasket 310 extends over the double sided vacuum tape 312 available from 3M. Additionally, a second piece of double sided vacuum tape 314 is disposed between an inner surface 316 of the front plane panel 204 and the gasket 310. Because the first breather subassembly 304 has a sufficient rigidity that could puncture the gasket 310, anti-puncture tape 318 is disposed on an upper surface 320 of the first breather subassembly 304. The gasket 310 extends over the double sided vacuum tape 314. Vacuum is drawn, as illustrated by arrow "E", through an opening 324 in the gasket 312 using a vacuum pump (not shown in FIG. 3) and is measured at a vacuum gauge 322 that is coupled to the image panel 102 at a location remote from the breather assembly 302. FIG. 3 also shows the viewable area of the screen and the non-viewable area (shown by arrows "E") of the screen. The viewable area is to the right of the non-viewable area in FIG. 3. The non-viewable area with have the same physical cross-section as the viewable area to conduct vacuum. The edging of the protective front panel 204 and the edging of the image panel 202 in the non-viewable area may be made with materials other than phosphors to save cost. The side edging may be black polyethylene terephthalate strips with a thickness of about 300 μm with no structure for conducting vacuum.

Figure 4:
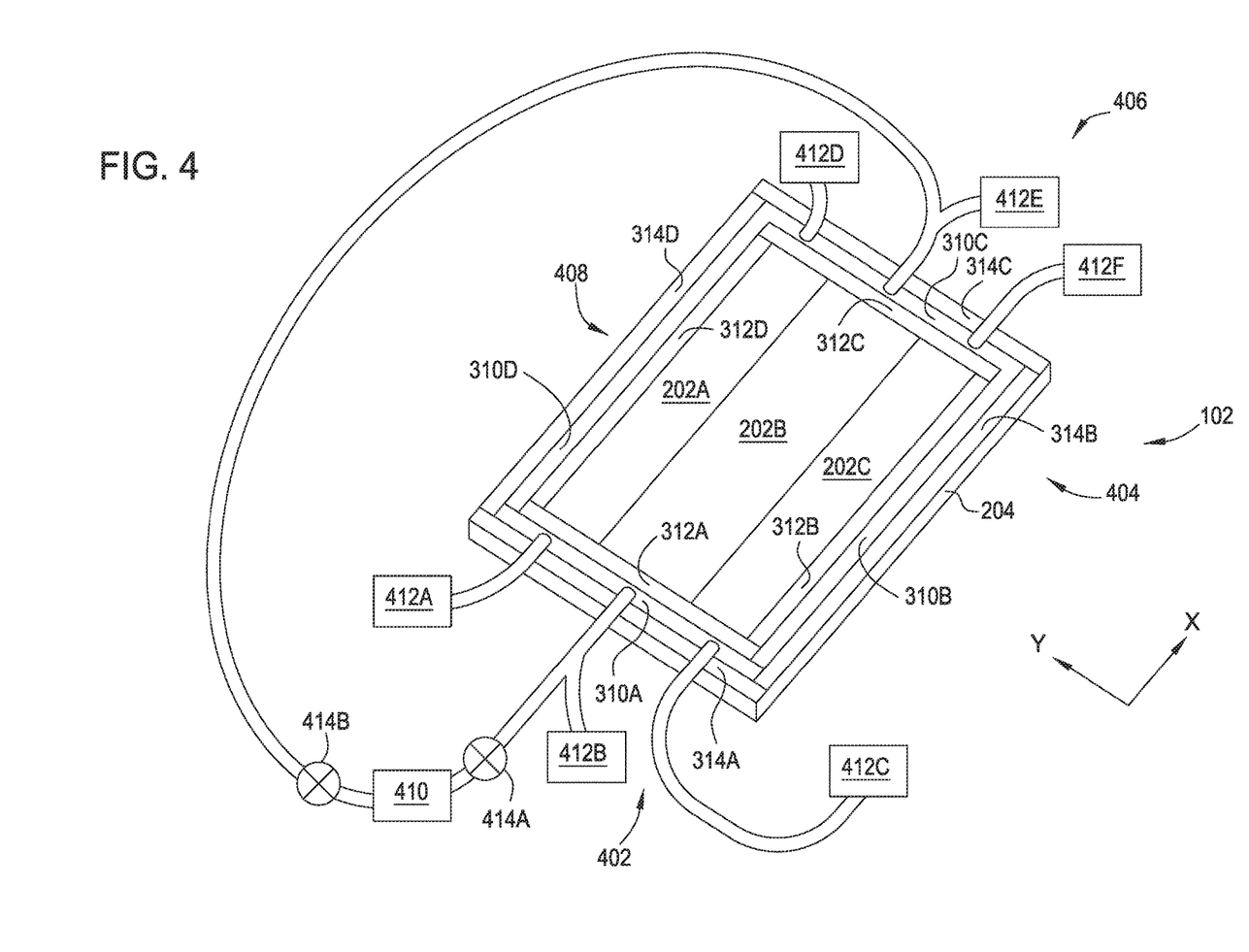
FIG. 4 is a schematic isometric illustration of an image panel having a breather assembly.

FIG. 4 is a schematic isometric illustration of an image panel 102 having a breather assembly. The image panel 102 includes the front plane panel 204 and a plurality of image panel portions 202A-202C. The breather assembly 302 includes one or more gaskets 310A-310D. It is to be understood that while a molder rectangular gasket has been shown corresponding to each side of the image panel 102, a single gasket may be used. In FIG. 4, a first gasket 310A is shown corresponding to the top side 402 of the image panel 102, a second gasket 310B is shown corresponding to a side 404 of the image panel 102, a third gasket 310C is shown corresponding to the bottom side 406 of the image panel 102, and a fourth gasket 310D is shown corresponding to another side 408. A piece of vacuum tape is used to tape the gaskets 310A-310D together at the intersection of the gaskets 310A-310D. At the intersection of two gaskets 310A-310D is the natural end of each respective gasket. The ends of the respective gaskets are not connected and thus, vacuum leakage can occur at the intersection. To prevent any leakage at the intersection, the vacuum tape covers the intersection by sticking to both gaskets and thus sealing the intersection. Further sealing is provided with a solvent based sealant. The tape and sealant are used to ensure that little to no vacuum leaks occur at the intersections. The gaskets 310A-310D all extend for the entire length of the corresponding side.

The gasket 310A is coupled to the front plane panel 204 by a first piece of double sided vacuum tape 314A. In the embodiment shown in FIG. 4, the tape 314A extends beyond the gasket 310A, but it is to be understood that the tape 314A may be completely disposed under the gasket 310A. The gaskets range from 200 to 500 mm thick while the tape ranges from 0.75 to 1.25 mm thick. Similar to FIG. 3, the tape 314A is coupled to both the gasket 310A and the front plane panel 204. The gasket 310B is coupled to the front plane panel 204 by a second piece of double sided vacuum tape 314B. Similar to FIG. 3, the tape 314B is coupled between both the gasket 310B and the front plane panel 204. The gasket 310C is coupled to the front plane panel 204 by a third piece of double sided vacuum tape 314C. Similar to FIG. 3, the tape 314C is coupled between both the gasket 310C and the front plane panel 204. The gasket 310D is coupled to the front plane panel 204 by a fourth piece of double sided vacuum tape 314D. Similar to FIG. 3, the tape 314D is coupled between both the gasket 310D and the front plane panel 204.

The gaskets 310A-310D are also coupled to the image panel portions 202A-202C. Gasket 310A is coupled to image panel portions 202A-202C using a fifth piece of double sided vacuum tape 312A. In the embodiment shown in FIG. 4, the tape 312A extends beyond the gasket 310A, but it is to be understood that the tape 312A may be completely disposed under the gasket 310A. Similar to FIG. 3, the tape 312A is coupled to both the gasket 310A and the image panel portions 202A-202C on the outside surface (i.e., image panel border) of the image panel portions 202A-202C. The gasket 310B is coupled between the image panel portion 202C by a sixth piece of double sided vacuum tape 312B. Similar to FIG. 3, the tape 312B is coupled to both the gasket 310B and the image panel portion 202C. The gasket 310C is also coupled to the image panel portions 202A-202C by a seventh piece of double sided vacuum tape 312C. Similar to FIG. 3, the tape 312C is coupled between both the gasket 310C and the image panel portions 202A-202C. The gasket 310D is coupled to the image panel portion 202A by an eighth piece of double sided vacuum tape 312D. Similar to FIG. 3, the tape 312D is coupled between both the gasket 310D and the image panel portion 202A.

A vacuum pump 410 is coupled to a vacuum line that is coupled to vacuum ports that penetrate the gaskets 310A, 310C. Additionally, vacuum gauges 412A-412F are coupled to the gaskets 310A, 310C. The gauges 412A-412F are spaced along the gaskets 310A, 310C to provide vacuum measurements near the edges (using gauges 412A, 412C, 412D, 412F) and the center (using gauges 412B, 412E). While no gauges are present along the sides of the image panel 102 because the vacuum is drawn through the top and bottom of the image panel, it is contemplated that one or more vacuum gauges may be utilized to measure the vacuum level through the side of the image panel 102. In one embodiment, no gauges 412A-412F are utilized. Valves 414A, 414B are coupled between the gaskets 310A, 310C and the vacuum pump 410 to be used to permit vacuum to be drawn from the image panel 102 at the top side 402 and bottom side 406. The vacuum pump 410 is not connected to the gaskets 310B, 310D at the sides 404, 408. Drawing a vacuum through the gaskets 310B, 310D at the sides 404, 408 would have an inconsequential effect as the phosphors extend from the top side 402 to the bottom side 406 and thus, the first low index of refraction material stripes 210 and second low index of refraction material pockets 212 extend from the top side 402 to the bottom side 406 along the Y axis. It is to be understood that the edges of the phosphor regions do not have any obstructions that would prevent evacuating the air out of the low index of refraction areas so that there is a clear path to reach all of the low index of refraction stripes 210 and pockets 212. Thus, the most effective locations to draw a vacuum are from the top side 420 and the bottom side 406.

Figure 5:
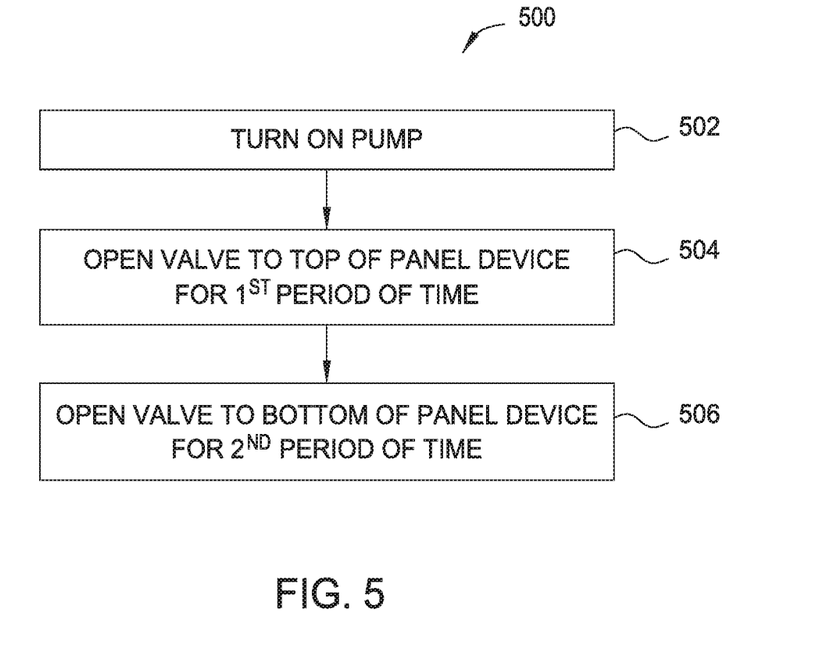
FIG. 5 is a flow chart exemplifying the method of compressing the image panel.

FIG. 5 is a flow chart 500 exemplifying the method of compressing the image panel 102. Once all of the gaskets 310A-310B are in place, the process begins by turning on the vacuum pump 410 as shown in block 502. Valve 414A is opened, as shown in block 504, for a first period of time to permit the vacuum to be drawn through the breather assembly at the top side 402. It is to be understood that the terms "top" and "bottom" are relative terms in regards to locations of the image panel. One of ordinary skill in the art could begin drawing the vacuum from the "bottom" first and then the "top" to, in essence, reverse the process order if desired with no impact upon performance. While the valve 414A is opened during the first period of time, valve 414B is closed and hence, the only location where the vacuum is drawn is through the gasket 310A and no vacuum is drawn from the bottom or sides of the image panel 102. The bottom draw is started only after the image panel is pumped flat after the first period of time. After the first period of time, valve 414B is opened as shown in block 506 so that a vacuum may be drawn through the breather assembly at the bottom side 406. Both valves 414A, 414B are thus opened for a second period of time such that a vacuum can be drawn through both gasket 310A and gasket 310C. By opening valve 414A first (without opening valve 414B) for a first period of time, and then opening valve 414B (along with valve 414A) for a second period of time, the image panel 102 is "walked" flat from the top center area and to the sides. If valves 414A and 414B were both open for the first period of time, then the image panel 102 would be "walked" down to the horizontal center (along the X axis) of the image panel 102 and trap a buckle at the horizontal center. Thus, in the embodiment discussed in FIG. 5, following the second period of time, the image panel portions 202A-202C and the front plane panel 204 are spaced apart by a spatial gap (arrows "E" in FIG. 2C) that is substantially uniform across the entire image panel 102. For this "steady state" period, both valves 414A, 414B are open. The vacuum level obtained after the second period of time is selected from the group consisting of between about 0.5 psi to about 1 psi, between about 1 psi and about 1.5 psi, between about 1.5 psi and about 2 psi, between about 2 psi and about 2.5 psi, between about 2.5 psi and about 3 psi, between about 3 psi and about 3.5 psi, between about 3.5 psi and about 4 psi, between about 4 psi and about 4.5 psi, between about 4.5 psi and about 5 psi, between about 5 psi and about 5.5 psi. During the first period of time, the front plane panel 204 and the image panel portions 202A-202C are pulled together by a distance that is greater than the distance that the front plane panel 204 and the image panel portions 202A-202C are pulled together (i.e., drawn closer together by the removal of the low index of refraction material) during the second period of time. In one embodiment, the image panel portions 202A-202C and the front plane panel 204 are not drawn any closer together during the second period of time. Additionally, the second period of time is longer than the first period of time. During the first period of time, the two panels are pulled together by a distance that is greater than a distance the two panels are pulled together in the second period of time, and wherein the second period of time is greater than the first period of time.

By utilizing the breather assembly, the un-bonded region (i.e., the gasket area) allows relative movement, which permits the screen to be rolled up for transport and storage with little or no shear stress on the gasket pressure sensitive adhesive, of the image panel portions and the front plane panel without unduly stressing the total image panel when the image panel is rolled or in operation with elevated temperatures. The gasket is bonded with vacuum tape to the front plane panel to create an outer slippage area between the phosphor stripes and the front plane panel as the coefficient of thermal expansion is different between the image panel portions and the front plane panel. The arrangement allows for minor slippage while maintaining the air gaps and air pockets between the phosphors and the front plane panel. The slippage is beneficial when rolling up the screen for transportation purposes. The vacuum hold-down allows the image panel to move independently of the protective panel when rolled for shipping. If the image panel were adhesively bonded to the protective panel, then the panel could not be rolled for shipping without creating severe strain on the device which would likely lead to device failure. By ensuring a substantially uniform vacuum level is present within the image panel, an amount of pressure applied to the protective front plane panel to indicating a touching event is substantially uniform across the protective front plane panel. Additionally, the image panel is pulled substantially flat without using any clamping device.

While the foregoing is directed to embodiments of the present disclosure, other and further embodiments of the disclosure may be devised without departing from the basic scope thereof, and the scope thereof is determined by the claims that follow.

I claim:

1. A method of compressing an image panel set together to reduce relative movement during thermal expansion of the image panel, wherein the image panel has one or more sealing gaskets coupled to two or more side edge regions thereof, and a breather assembly coupled to the image panel at a top side and a bottom side thereof, comprising:
  drawing a vacuum through the breather assembly at the top side for a first period of time; and
  drawing a vacuum through the breather assembly at the bottom side for a second period of time, wherein the second period of time occurs after the first period of time and wherein the two panels maintain a substantially uniformly spatial gap across the entire image panel following the second period of time.

2. The method of claim 1, further comprising continuing to draw vacuum through the breather assembly at the top side during the second period of time.

3. The method of claim 1, wherein the vacuum level after the second period of time is one of between 0.5-1 psi, 1-1.5 psi, 1.5-2 psi, 2-2.5 psi, 2.5-3 psi, 3-3.5 psi, 3.5-4 psi, 4-4.5, 4.5-5 psi, or 5-5.5 psi.

4. The method of claim 1, wherein the breather assembly comprises a first breather subassembly, a second breather subassembly distinct from the first breather subassembly, wherein the first breather subassembly has a first rigidity and the second breather subassembly has a second rigidity and wherein the first rigidity is greater than the second rigidity, wherein the first breather subassembly has a first thickness and the second breather subassembly has a second thickness and wherein the first thickness is greater than the second thickness, wherein the second breather subassembly is disposed between two panels of the image panel and the first breather subassembly is disposed on one panel of the two panels and spaced from a second panel of the two panels, and wherein the first breather subassembly extends for the entire length of the top side of the first and second panels.

5. The method of claim 1, wherein the image panel comprises a plurality of phosphor stripes disposed between two panels of the image panel.

6. The method of claim 5, wherein the plurality of phosphor stripes are spaced from a first panel of the two panels, wherein the plurality of phosphor stripes are in contact with a second panel of the two panels, and wherein a plurality of air pockets are present between the second panel and the plurality of phosphor stripes.

7. The method of claim 1, wherein the image panel comprises two panels each having a different coefficient of thermal expansion.

8. The method of claim 7, wherein during the first period of time and the second period of time the two panels are pulled closer together, wherein during the first period of time the two panels are pulled together by a distance that is greater than a distance the two panels are pulled together in the second period of time, and wherein the second period of time is greater than the first period of time.

9. A vacuum enclosed image panel device, comprising:
  a first panel having a top edge, a bottom edge, a first side edge and a second side edge;
  a second panel having a top edge, a bottom edge, a first side edge and a second side edge; and
  a first breather assembly coupled between the first panel and second panel, wherein the first panel and the second panel are substantially uniformly spaced apart under vacuum to reduce relative movement during thermal expansion wherein the first panel and the second panel have different coefficients of thermal expansion.

10. The device of claim 9, wherein the first breather assembly comprises a first breather subassembly and a second breather subassembly distinct from the first breather subassembly.

11. The device of claim 10, wherein the first breather subassembly has a first rigidity and the second breather subassembly has a second rigidity and wherein the first rigidity is greater than the second rigidity.

12. The device of claim 10, wherein the first breather subassembly has a first thickness and the second breather subassembly has a second thickness and wherein the first thickness is greater than the second thickness.

13. The device of claim 10, wherein the second breather subassembly is disposed between the two panels and the first breather subassembly is disposed on one panel and spaced from a second panel.

14. The device of claim 10, wherein the first breather subassembly extends for the entire length of the top side of the first and second panels.

15. The device of claim 10, further comprising one or more vacuum gauges coupled to the first breather subassembly.

16. The device of claim 9, further comprising a plurality of phosphor stripes sandwiched between the first panel and the second panel, wherein the phosphor stripes extend from the top sides of the first and second panels to the bottom sides of the first panel and the second panel.

17. The device of claim 9, further comprising:
  one or more sealing gaskets coupled to the first side and the second side.

18. The device of claim 9, wherein there is no clamping device clamping the first panel to the second panel.

19. The device of claim 9, wherein the first panel is a touch panel and wherein an amount of pressure applied to the first panel to indicate a touching event is substantially uniform across the first panel.

20. A vacuum enclosed image panel device, comprising:
  a first panel having a top edge, a bottom edge, a first side edge and a second side edge, wherein the first panel is a multilayer structure having:
    an anti-glare coating;
    a first polyethylene terephthalate layer disposed on the anti-glare coating;
    a first pressure sensitive adhesive on the first polyethylene terephthalate layer;
    a polycarbonate layer disposed on the pressure sensitive adhesive;
    a second pressure sensitive adhesive on the polycarbonate layer;
    a second polyethylene terephthalate layer disposed on the second pressure sensitive adhesive;
  a second panel having a top edge, a bottom edge, a first side edge and a second side edge, wherein the second panel is disposed opposite the anti-glare coating of the first panel; and
  a first breather assembly, wherein the first breather assembly includes:
    a third pressure sensitive adhesive layer coupled to the second panel;
    a fourth pressure sensitive adhesive layer coupled to the first panel; and
    a gasket coupled to the third pressure sensitive adhesive layer and the fourth pressure sensitive adhesive layer, wherein the first panel and the second panel are substantially uniformly spaced apart under vacuum to reduce relative movement during thermal expansion.

21. The device of claim 20, wherein the breather assembly comprises a first breather subassembly and a second breather subassembly distinct from the first breather subassembly.

22. The device of claim 21, wherein the first breather subassembly has a first rigidity and the second breather subassembly has a second rigidity and wherein the first rigidity is greater than the second rigidity.

23. The device of claim 21, wherein the first breather subassembly has a first thickness and the second breather subassembly has a second thickness and wherein the first thickness is greater than the second thickness.

24. The device of claim 21, wherein the second breather subassembly is disposed between the two panels and the first breather subassembly is disposed on one panel and spaced from a second panel.

25. The device of claim 21, wherein the first breather subassembly extends for the entire length of the top side of the first and second panels.

26. The device of claim 20, further comprising one or more vacuum gauges coupled to the breather assembly.

27. The device of claim 20, wherein the first panel and the second panel have different coefficients of thermal expansion.

* * * * *